United States Patent
Peng et al.

(10) Patent No.: US 10,340,366 B2
(45) Date of Patent: Jul. 2, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Yi Peng, Taipei (TW); Chih Chieh Yeh, Taipei (TW); Chih-Sheng Chang, Hsinchu (TW); Hung-Li Chiang, Taipei (TW); Hung-Ming Chen, Zhubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/653,094

(22) Filed: Jul. 18, 2017

(65) Prior Publication Data
US 2017/0317193 A1 Nov. 2, 2017

Related U.S. Application Data

(62) Division of application No. 14/714,227, filed on May 15, 2015, now Pat. No. 9,741,829.

(51) Int. Cl.
*H01L 29/66* (2006.01)
*H01L 29/78* (2006.01)
(Continued)

(52) U.S. Cl.
CPC .... *H01L 29/66795* (2013.01); *H01L 29/0649* (2013.01); *H01L 29/41725* (2013.01);
(Continued)

(58) Field of Classification Search
CPC ............ H01L 29/66795; H01L 29/785; H01L 29/0649; H01L 29/42356; H01L 29/41791; H01L 29/41725; H01L 29/6681
See application file for complete search history.

(56) References Cited

U.S. PATENT DOCUMENTS 6,174,793 B1   1/2001 Tsai et al.
7,667,271 B2   2/2010 Yu et al.
(Continued)

FOREIGN PATENT DOCUMENTS

CN    101419979 A    4/2009
CN    103377924 A    10/2013
(Continued)

OTHER PUBLICATIONS

Office Action Taiwan Patent Application No. 10-2015-0109490 dated Jul. 4, 2016 with English translation.
(Continued)

*Primary Examiner* — Vongsavanh Sengdara
(74) *Attorney, Agent, or Firm* — McDermott Will & Emery LLP

(57) ABSTRACT

A semiconductor device comprises a fin structure disposed over a substrate; a gate structure disposed over part of the fin structure; a source/drain structure, which includes part of the fin structure not covered by the gate structure; an interlayer dielectric layer formed over the fin structure, the gate structure, and the source/drain structure; a contact hole formed in the interlayer dielectric layer; and a contact material disposed in the contact hole. The fin structure extends in a first direction and includes an upper layer, wherein a part of the upper layer is exposed from an isolation insulating layer. The gate structure extends in a
(Continued)

second direction perpendicular to the first direction. The contact material includes a silicon phosphide layer and a metal layer.

21 Claims, 25 Drawing Sheets

(51) Int. Cl.
*H01L 29/06* (2006.01)
*H01L 29/417* (2006.01)
*H01L 29/423* (2006.01)

(52) U.S. Cl.
CPC .. *H01L 29/41791* (2013.01); *H01L 29/42356* (2013.01); *H01L 29/785* (2013.01); *H01L 29/6681* (2013.01)

(56) References Cited

U.S. PATENT DOCUMENTS

| | | | |
|---|---|---|---|
| 7,781,799 B2 | 8/2010 | Yu et al. | |
| 7,910,453 B2 | 3/2011 | Xu et al. | |
| 7,973,337 B2 | 7/2011 | Yu et al. | |
| 8,168,501 B2 | 5/2012 | Yu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2008/0048262 A1* | 2/2008 | Lee | H01L 29/41791 257/347 |
| 2009/0108290 A1* | 4/2009 | Yu | H01L 21/82380 257/190 |
| 2010/0289086 A1 | 11/2010 | Yu et al. | |
| 2011/0230022 A1 | 9/2011 | Yu et al. | |
| 2012/0153387 A1 | 6/2012 | Murthy et al. | |
| 2013/0026539 A1* | 1/2013 | Tang | H01L 29/66803 257/192 |
| 2013/0234203 A1 | 9/2013 | Tsai et al. | |
| 2014/0001574 A1 | 1/2014 | Chen et al. | |
| 2014/0110755 A1 | 4/2014 | Colinge | |
| 2014/0124842 A1* | 5/2014 | Wang | H01L 23/485 257/288 |
| 2014/0151812 A1 | 6/2014 | Liaw | |
| 2016/0133721 A1* | 5/2016 | Cai | H01L 29/4958 257/506 |

FOREIGN PATENT DOCUMENTS

| | | |
|---|---|---|
| KR | 2013-0103265 A | 9/2013 |
| KR | 2013-0111595 A | 10/2013 |
| WO | 2015032274 A1 | 3/2015 |

OTHER PUBLICATIONS

Notice of Allowance of Patent Korean Patant Application No. 10-2015-0109490 dated Dec. 5, 2016 with English translation.
Taiwanese Search Report dated Jun. 20, 2017, issued in Taiwanese Application No. 104139205.

* cited by examiner

SEMICONDUCTOR DEVICE AND MANUFACTURING METHOD THEREOF

CROSS REFERENCE TO RELATED APPLICATIONS

This application is a Divisional Application of U.S. application Ser. No. 14/714,227 filed May 15, 2015, the entire disclosure of which is incorporated herein by reference.

TECHNICAL FIELD

The disclosure relates to a semiconductor integrated circuit, more particularly to a semiconductor device having a metal gate structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed in a recessed fin by using an epitaxial growth method. Further, germanium (Ge) or a Ge compound is also used as a base material instead of silicon for its higher electron mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
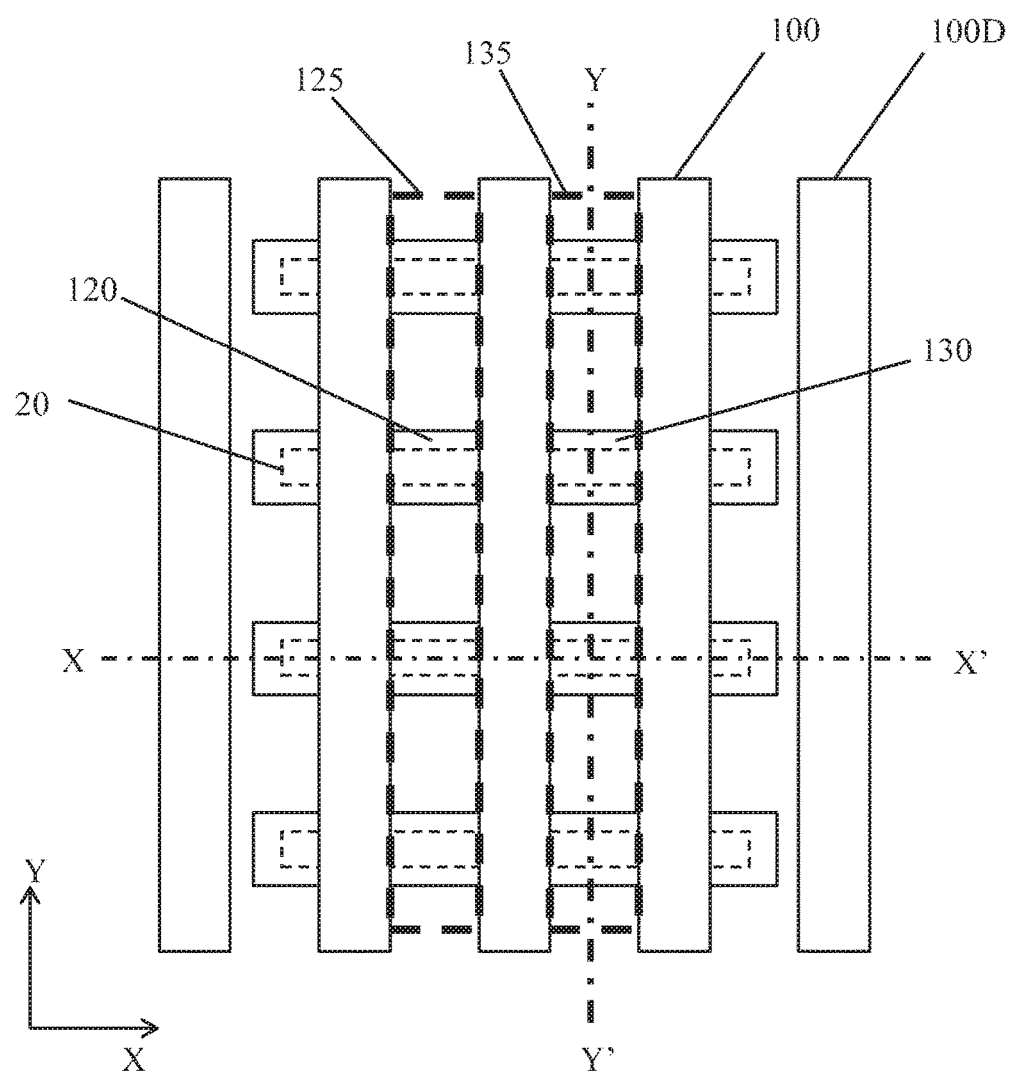
FIG. 1 is an exemplary plan view of a Ge Fin FET device according to one embodiment of the present disclosure.

FIG. 1 is an exemplary plan view of a Ge Fin FET device according to one embodiment of the present disclosure. In one embodiment, the Ge Fin FET is an N-type FET.

In one embodiment of the present disclosure, multiple fin structures 20 are disposed over a substrate 10 and multiple gate electrodes 100 are disposed over the fin structures 20, as shown in FIG. 1. In some embodiments, one or more dummy gate electrodes 100D are also disposed at both sides of the gate electrodes 100 over the substrate 10. Similarly, one or more dummy fin structures may be disposed at both sides of the fin structures 20. Although in FIG. 1, the dummy gate electrodes 100D are not disposed over any part of fin structures, the dummy gate electrodes 100D may be disposed over part of the fin structures 20 in some embodiments. As shown in FIG. 1, four fin structures 20 extend in the X direction and three gate electrodes 100 and two dummy gate electrodes 100D extend in the Y direction. However, the number of fins structures and/or gate electrodes is not limited.

As shown in FIG. 1, the Fin FET device also includes a source 120 and a drain 130. As set forth below, due to an epitaxial growth of a source/drain material, the width of the source and drain in plan view is wider than the width of the fin structure. The Fin FET device further includes a source contact 125 and a drain contact 135.

Figure 2:
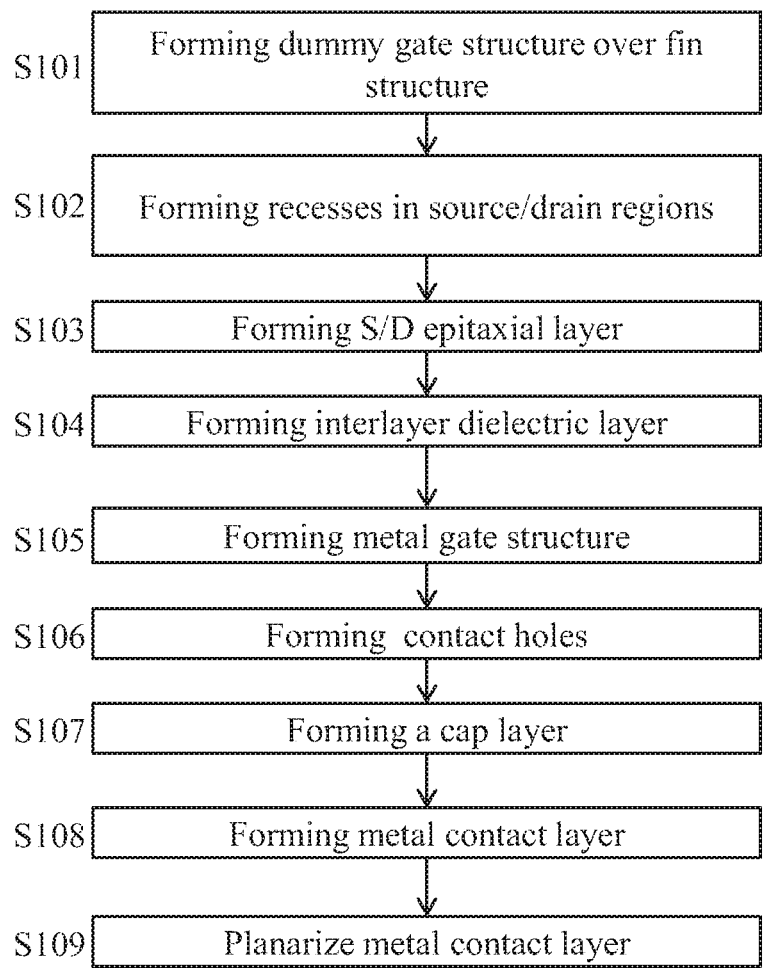
FIG. 2 is an exemplary flow chart for manufacturing a Ge Fin FET device according to a first embodiment of the present disclosure.

FIG. 2 is an exemplary flow chart for manufacturing a Ge Fin FET device according to a first embodiment of the present disclosure. The flow chart illustrates only a relevant part of the entire manufacturing process for a Ge Fin FET device. It is understood that additional operations may be provided before, during, and after the operations shown by FIG. 2, and some of the operations described below can be replaced or eliminated for additional embodiments of the method. The order of the operations/processes may be interchangeable.

The following embodiments mainly describe a Ge Fin FET device as one example of the semiconductor device and the manufacturing method thereof, and the technologies described herein are also applicable to horizontal multi-gate transistors, stacked nanowire transistors and/or tri-gate transistors.

Figure 3A:
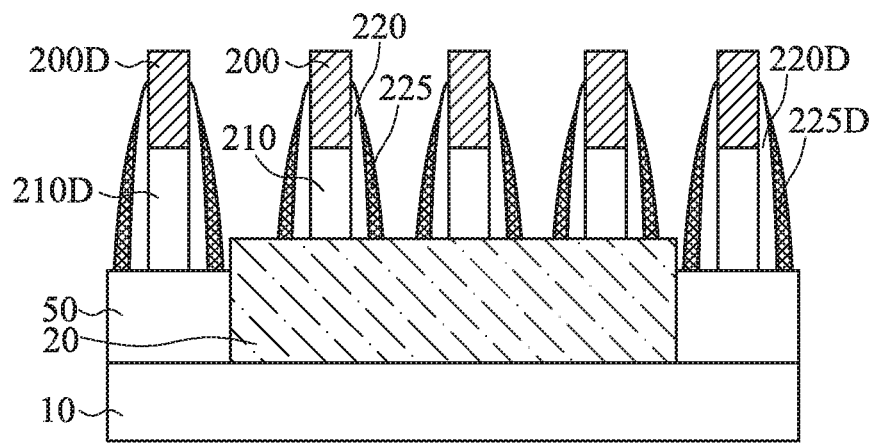
FIGS. 3A-11B show exemplary views of various stages for manufacturing a Ge Fin FET device according to the first embodiment of the present disclosure.
Figure 3B:
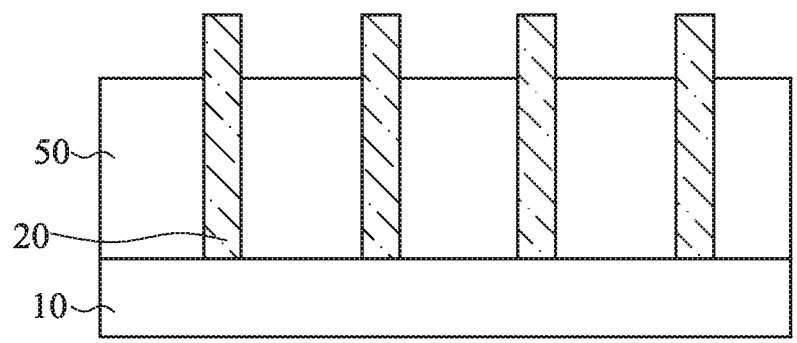

FIGS. 3A and 3B are exemplary cross sectional views a Ge Fin FET device at one of the various stages of the fabrication process according to the first embodiment of the present disclosure. FIG. 3A corresponds to a cross sectional view along the line X-X' of FIG. 1 and FIG. 3B corresponds to a cross sectional view along the line Y-Y' of FIG. 1.

In S101 of FIG. 2, dummy gate structures are formed over a substrate 10. Fin structures 20 are fabricated over the substrate, and protrude from an isolation insulating layer 50. The portions of the fin structures 20 protruding from the isolation insulating layer 50 function as channel layers.

To fabricate fin structures according to one embodiment, a mask layer is formed over a substrate. The mask layer is formed by, for example, a thermal oxidation process and/or a chemical vapor deposition (CVD) process. The substrate 10 is, for example, a p-type silicon or germanium substrate with an impurity concentration in a range of about $1 \times 10^{15}$ $cm^{-3}$ to about $1 \times 10^{16}$ $cm^{-3}$. In other embodiments, the substrate is an n-type silicon or germanium substrate with an impurity concentration in a range of about $1 \times 10^{15}$ $cm^{-3}$ to about $1 \times 10^{16}$ $cm^{-3}$. The mask layer includes, for example, a pad oxide (e.g., silicon oxide) layer and a silicon nitride mask layer in some embodiments. The substrate 10 may also be a $Si_xGe_{1-x}$ substrate, where x=0.1 to 0.9 (hereinafter referred to as SiGe). The germanium substrate may include a germanium layer or a SiGe layer formed over another substrate such as a silicon substrate. Further, the germanium substrate may include a germanium layer or a SiGe layer formed over an oxide layer (e.g., SiGe oxide) that is disposed over another substrate. The substrate may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate is patterned into fin structures 20 by trench etching using a dry etching method and/or a wet etching method. A height of the fin structures 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structures 20 is in a range of about 4 nm to about 15 nm.

When multiple fin structures are disposed, the space between the fin structures is in a range of about 5 nm to about 80 nm in some embodiments, and may be in a range of about 7 nm to about 15 nm in other embodiments. One skilled in the art will realize, however, that the dimensions and values recited throughout the descriptions are merely examples, and may be changed to suit different scales of integrated circuits.

After forming the fin structures 20, an isolation insulating layer 50 is formed over the fin structures 20. The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50 over the fin structures 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer (upper layer) of the fin structures 20 is exposed. The height of the channel layer (upper layer) is in a rage of about 20 nm to about 60 nm.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

A dielectric layer and a poly silicon layer are formed over the isolation insulating layer 50 and the exposed fin structure, and then patterning operations are performed so as to obtain a dummy gate structure including dummy gate layers 210, 210D made of poly silicon and a dummy gate dielectric layer (not shown). The patterning of the poly silicon layer is performed by using a hard mask 200, 200D including a silicon nitride layer formed over a silicon oxide layer in some embodiments. In other embodiments, the hard mask may include a silicon oxide layer formed over a silicon nitride layer. The dummy gate dielectric layer may be silicon oxide formed by CVD, PVD, ALD, e-beam evaporation, or other suitable process. In some embodiments, the gate dielectric layer may include one or more layers of silicon oxide, silicon nitride, silicon oxy-nitride, or high-k dielectrics. In some embodiments, a thickness of the gate dielectric layer is in a range of about 2 nm to about 20 nm, and in a range of about 2 nm to about 10 nm in other embodiments.

In some embodiments, the dummy gate layers 210, 210D may comprise a single layer or multilayer structure. The dummy gate layers 210, 201D may be doped poly silicon with uniform or non-uniform doping. The dummy gate layers 210, 210D may be formed using a suitable process such as ALD, CVD, PVD, or combinations thereof. In the present embodiment, the width of the dummy gate layers 210, 210D is in the range of about 30 nm to about 60 nm. In some embodiments, a thickness of the gate electrode layer is in a range of about 50 nm to about 400 nm, and may be in a range of about 100 nm to 200 nm.

Further, insulating spacer (side-wall spacer) layers are formed over the dummy gate structure. The insulating spacers may include silicon oxide layers 220, 220D and silicon nitride layers 225, 225D in some embodiments. As shown in FIG. 3A, three dummy gate electrodes layers 210 corresponding to gate electrodes 100 are disposed over the fin structures 20 (and the isolation insulating layer 50), and two dummy gate layers 210D corresponding to the dummy gate electrodes 100D are not disposed over the fin structures. A shown in FIG. 3B, part of the fin structures not covered by dummy gate layers become source and drain regions.

Figure 4A:
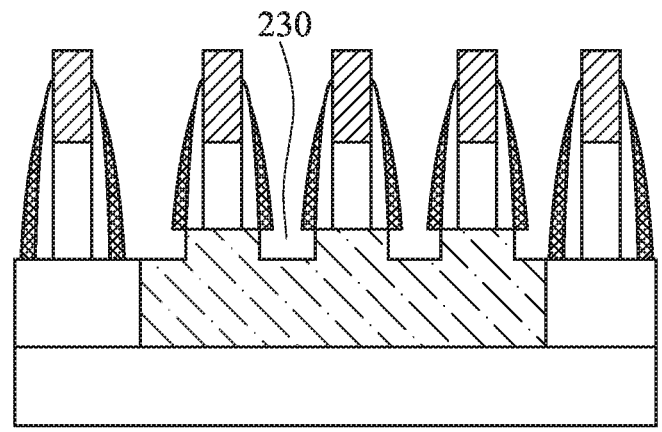
Figure 4B:
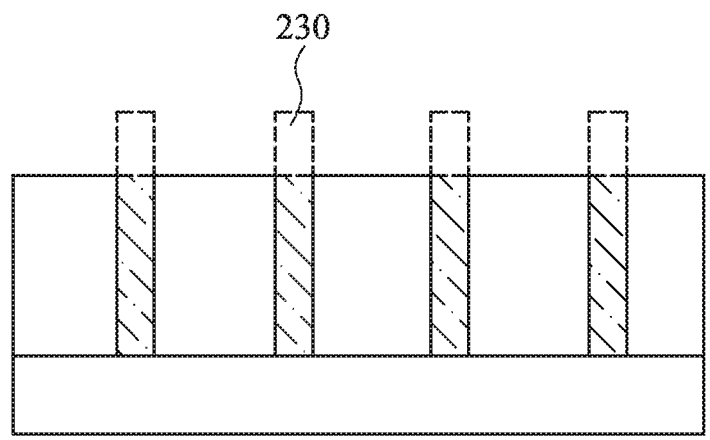

In S102 of FIG. 2, recesses 230 are formed in part of the fin structures not covered by dummy gate layers. FIGS. 4A and 4B are exemplary cross sectional views of the Ge Fin FET device at one of the various stages of the fabrication process according to the first embodiment of the present disclosure. FIG. 4A corresponds to a cross sectional view along the line X-X' of FIG. 1 and FIG. 4B corresponds to a cross sectional view along the line Y-Y' of FIG. 1. The depth of the recesses 230 is in a range of about 20 nm to about 60 nm in some embodiments.

The recess etching of the fin structures 20 is performed by plasma etching using gases including $CH_4$, $CF_4$, $CH_2F_2$, $CHF_3$, $O_2$, HBr, $Cl_2$, $NF_3$, $N_2$ and/or He under a pressure of 3 to 20 mTorr, in some embodiments. The recess etching is anisotropic etching.

Figure 5A:
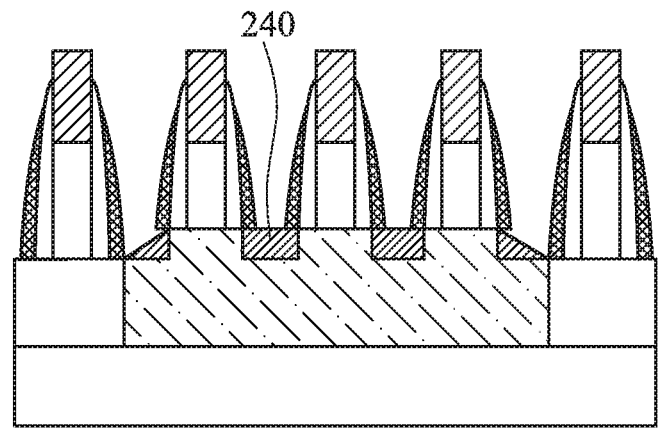
Figure 5B:
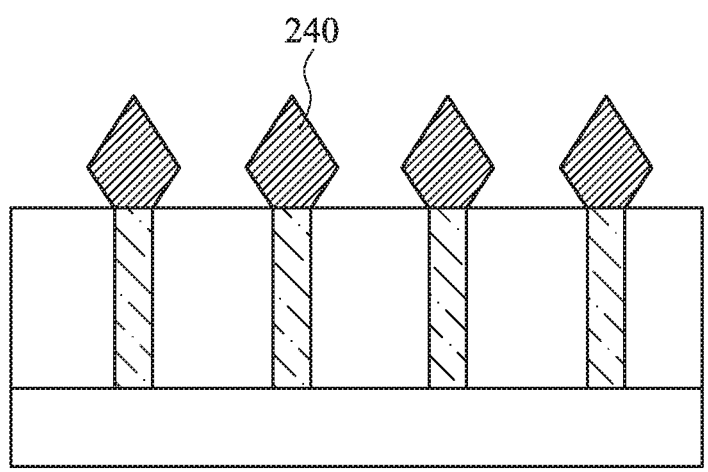

In S103 of FIG. 2, a source/drain (S/D) epitaxial layer 240 is formed in part of the fin structures not covered by dummy gate layers, as shown in FIGS. 5A and 5B. FIGS. 5A and 5B are exemplary cross sectional views of the Ge Fin FET device at one of the various stages of the fabrication process according to the first embodiment of the present disclosure. FIG. 5A corresponds to a cross sectional view along the line X-X' of FIG. 1 and FIG. 5B corresponds to a cross sectional view along the line Y-Y' of FIG. 1.

The S/D epitaxial layer 240 includes GeP (germanium phosphide) in some embodiments. A concentration of P may be in a range of about $1\times10^{20}$ to about $2\times10^{20}$ $cm^{-3}$. When the main surface of the substrate is a (100) surface, the S/D epitaxial layer grows vertically and laterally, and forms a "diamond" shape in the cross section, as shown in FIG. 5B. The GeP epitaxial grown is performed at a temperature of about 600 to 800° C. under a pressure of about 80 to 150 Torr, by using a Ge containing gas such as $GeH_4$, $Ge_2H_6$, $GeCl_2H_2$ and a phosphorous containing gas such as $PH_3$. With this epitaxial growth, the GeP layers are selectively formed in and over the recesses 230 of the fin structures.

Figure 6A:
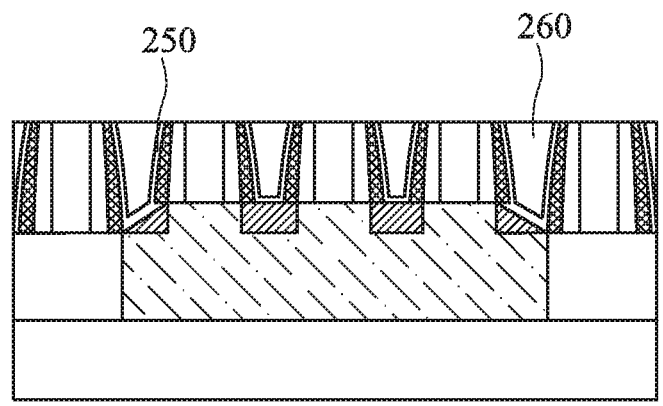
Figure 6B:
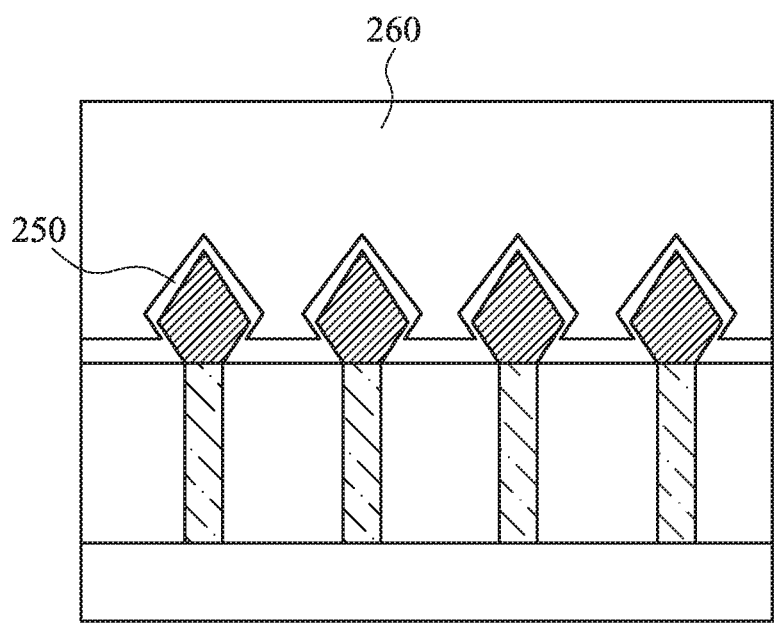

In S104 of FIG. 2, a first interlayer dielectric layer is formed over the resulting structure of FIGS. 5A and 5B, and planarization operations are performed. The resultant structure after the planarization operations are shown in FIGS. 6A and 6B. FIGS. 6A and 6B are exemplary cross sectional views of the Ge Fin FET device at one of the various stages of the fabrication process according to the first embodiment of the present disclosure. FIG. 6A corresponds to a cross sectional view along the line X-X' of FIG. 1 and FIG. 6B corresponds to a cross sectional view along the line Y-Y' of FIG. 1.

In some embodiments, the first interlayer dielectric layer may include a first dielectric layer 250 and a second dielectric layer 260. The first dielectric layer 250 may be made of silicon nitride and function as a contact-etch-stop layer. The second dielectric layer 260 may include one or more layers of silicon oxide, silicon nitride, silicon oxynitride (SiON), SiOCN, fluoride-doped silicate glass (FSG), or a low-K dielectric material, formed by CVD. In other embodiments, the first interlayer dielectric layer may be a single layer.

The planarization operations are performed to remove part of the first interlayer dielectric layer. The planarization operations include a chemical mechanical polishing (CMP) and/or an etch-back process. By this planarization operation, hard masks 200, 200D are also removed.

Figure 7A:
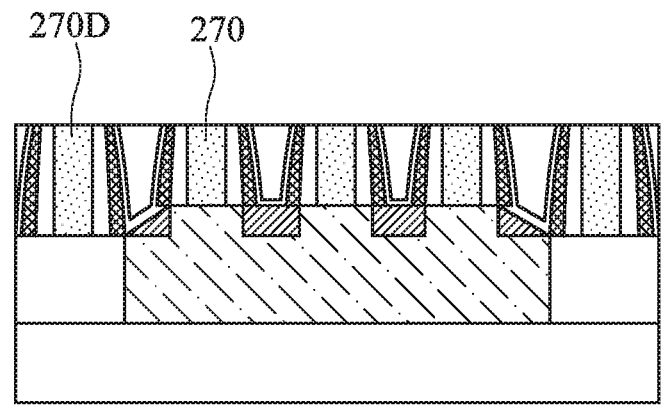
Figure 7B:
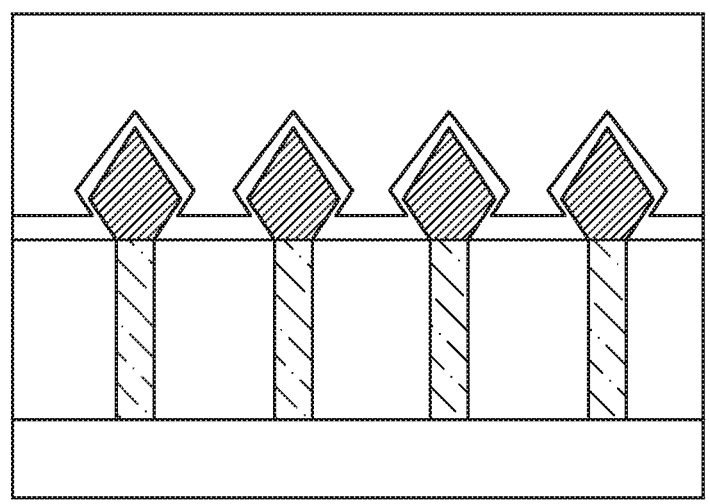

In S105 of FIG. 2, metal gate structures are formed, as shown in FIGS. 7A and 7B. FIGS. 7A and 7B are exemplary cross sectional views of the Ge Fin FET device at one of the various stages of the fabrication process according to the first embodiment of the present disclosure. FIG. 7A corresponds to a cross sectional view along the line X-X' of FIG. 1 and FIG. 7B corresponds to a cross sectional view along the line Y-Y' of FIG. 1.

The dummy gate layers 210, 210D and the dummy dielectric layer are removed, by appropriate etching processes, respectively, to form openings. Metal gate structures including a gate dielectric layer (not shown) and metal gate layers 270, 270D are formed in the openings, as shown in FIGS. 7A and 7B.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. The germanium oxide interface layer may be formed by oxidizing the Ge channel layer. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range of about 1 nm to about 10 nm in some embodiments, and may be in a range of about 2 nm to about 7 nm in other embodiments. In some embodiments, the gate dielectric layer 30 may include an interfacial layer made of silicon dioxide.

Metal gate electrodes 270, 270D are formed over the gate dielectric layer. The metal gate electrodes 270, 270D include any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrodes 270, 270D. The work function adjustment layers are made of a conductive material such as a single layer of TiN, TaN, TaAlC, TiC, TaC, Co, Al, TiAl, Hifi, TiSi, TaSi or TiAlC, or a multilayer of two or more of these materials. For the n-channel Fin FET, one or more of TaN, TaAlC, TiN, TiC, Co, TiAl, Hffi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations such as a CMP are performed, thereby obtaining the structure shown in FIGS. 7A and 7B.

Figure 8A:
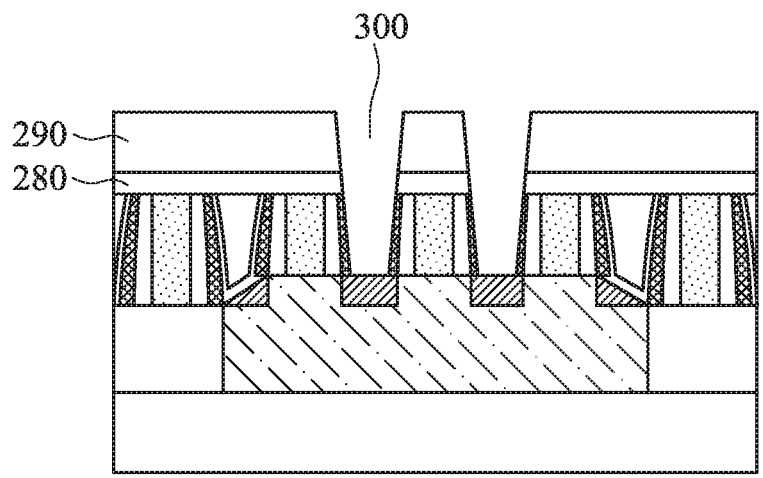
Figure 8B:
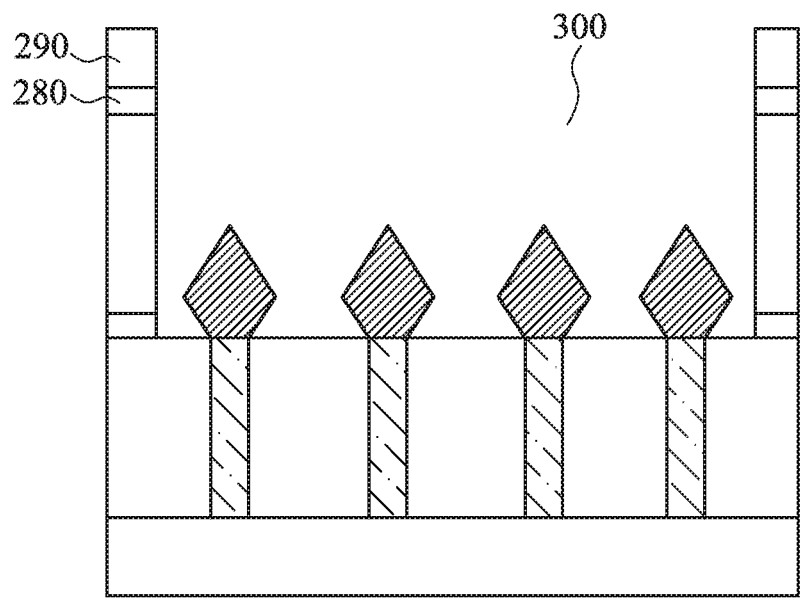

In S106 of FIG. 2, a second interlayer dielectric layer is formed over the resultant structure shown in FIGS. 7A and 7B, and contact holes 300 are formed as shown in FIGS. 8A and 8B. FIGS. 8A and 8B are exemplary cross sectional views of the Ge Fin FET device at one of the various stages of the fabrication process according to the first embodiment of the present disclosure. FIG. 8A corresponds to a cross sectional view along the line X-X' of FIG. 1 and FIG. 8B corresponds to a cross sectional view along the line Y-Y' of FIG. 1.

In some embodiments, the second interlayer dielectric layer may include a first insulating layer 280 and a second insulating layer 290. The first insulating layer 280 may be made of silicon nitride and function as a contact-etch-stop layer. The second insulating layer 290 may include silicon oxide, silicon nitride, silicon oxynitride (SiON), SiOCN, fluoride-doped silicate glass (FSG), or a low-K dielectric material, formed by CVD. In other embodiments, the second interlayer dielectric layer may be a single layer.

By using a patterning operation including lithography, contact holes 300 are formed in the second and first interlayer dielectric layers 280, 290, so as to expose source and drain regions.

Figure 9A:
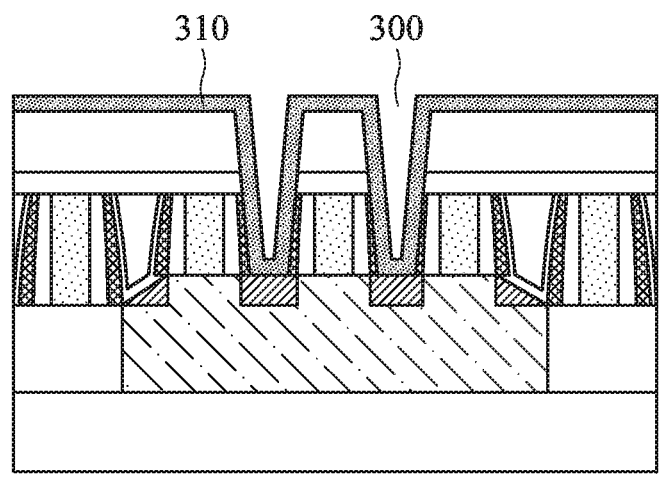
Figure 9B:
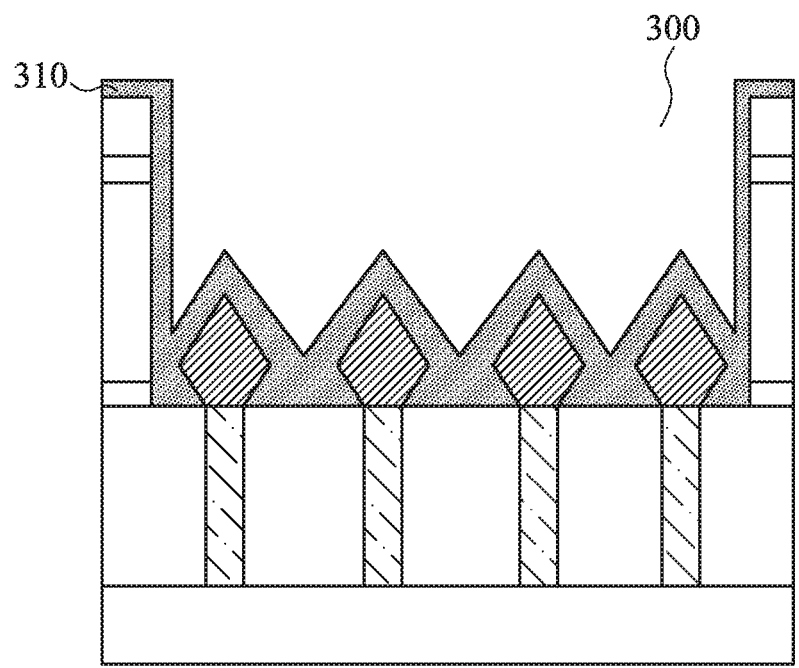

In S107 of FIG. 2, a cap layer 310 is formed in the contact holes as shown in FIGS. 9A and 9B. FIGS. 9A and 9B are exemplary cross sectional views of the Ge Fin FET device at one of the various stages of the fabrication process according to the first embodiment of the present disclosure. FIG. 9A corresponds to a cross sectional view along the line X-X' of FIG. 1 and FIG. 9B corresponds to a cross sectional view along the line Y-Y' of FIG. 1.

The cap layer 310 may include SiP (silicon phosphide). A concentration of P in the cap layer may be in a range of about $1\times10^{21}$ to about $3\times10^{21}$ cm$^{-3}$. The SiP formation is performed at a low temperature of about 300 to 600° C. under a pressure of about 20 to 60 Torr, by using a Si containing gas such as SiH$_4$, Si$_2$H$_6$, SiCl$_2$H$_2$ and a phosphorous containing gas such as PH$_3$. By this deposition, SiP is formed not only on the source/drain regions of the fin structures but also on the interlayer dielectric layers and the sidewalls of the contact holes 300. The thickness of the SiP layer 310 is in a range of about 8 nm to about 10 nm on the source/drain regions and in a range of about 4 nm to about 6 nm on the interlayer dielectric layers and the sidewalls of the contact holes 300. The SiP layer 310 may be epitaxially grown over the source/drain regions of the fin structures.

Figure 10A:
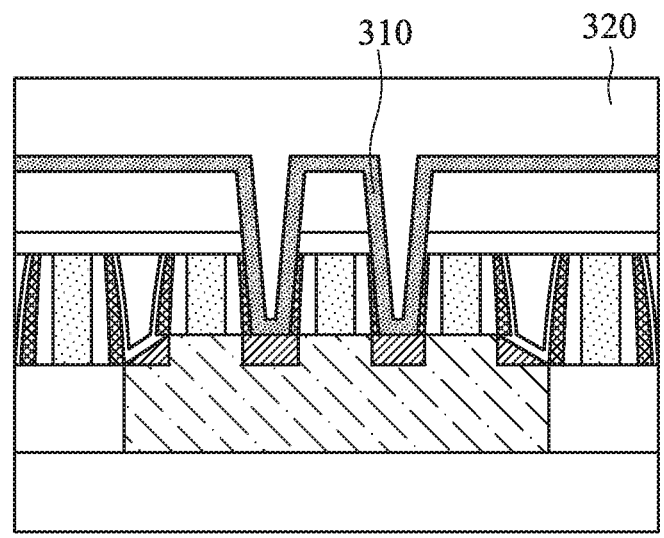
Figure 10B:
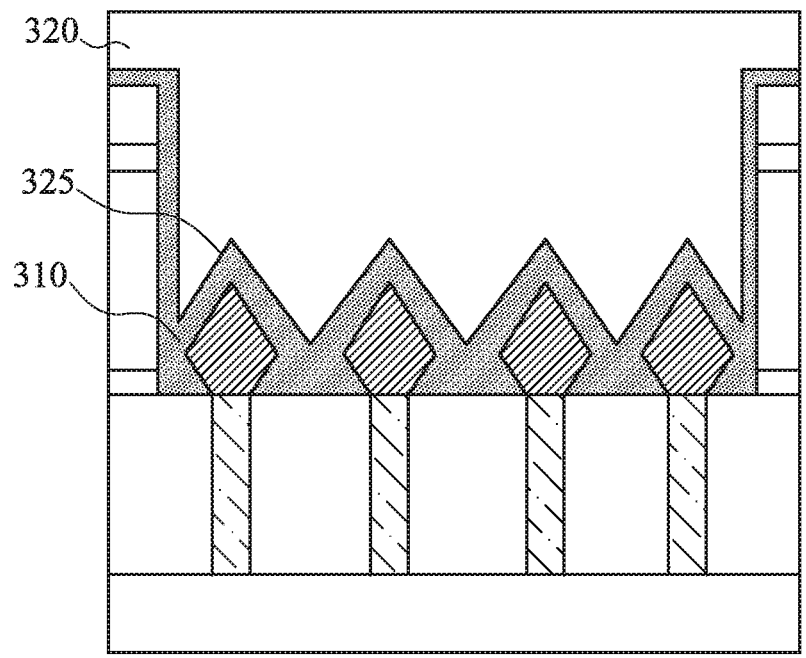

In S108 of FIG. 2, a contact metal layer 320 is formed over the cap layer 310 as shown in FIGS. 10A and 10B. FIGS. 10A and 10B are exemplary cross sectional views of the Ge Fin FET device at one of the various stages of the fabrication process according to the first embodiment of the present disclosure. FIG. 10A corresponds to a cross sectional view along the line X-X' of FIG. 1 and FIG. 10B corresponds to a cross sectional view along the line Y-Y' of FIG. 1.

The contact metal layer 320 may include a single layer or multiple layers of any suitable metal such as Co, W, Ti, Ta, Cu, Al and/or Ni and/or nitride thereof. After forming the contact metal layer 320, an alloy layer may be formed between the cap layer 310 and contact metal layer 320. For example, a silicide formation operation may be performed so as to make a silicide layer 325 between the contact metal layer 320 and SiP cap layer 310. The silicide formation operations may include an annealing process at a temperature of about 250° C. to 850° C.

The thickness of the silicide layer 325 on the source/drain regions is in a range of about 5 nm to about 7 nm, and a portion of the SiP layer remains after silicide formation.

Figure 11A:
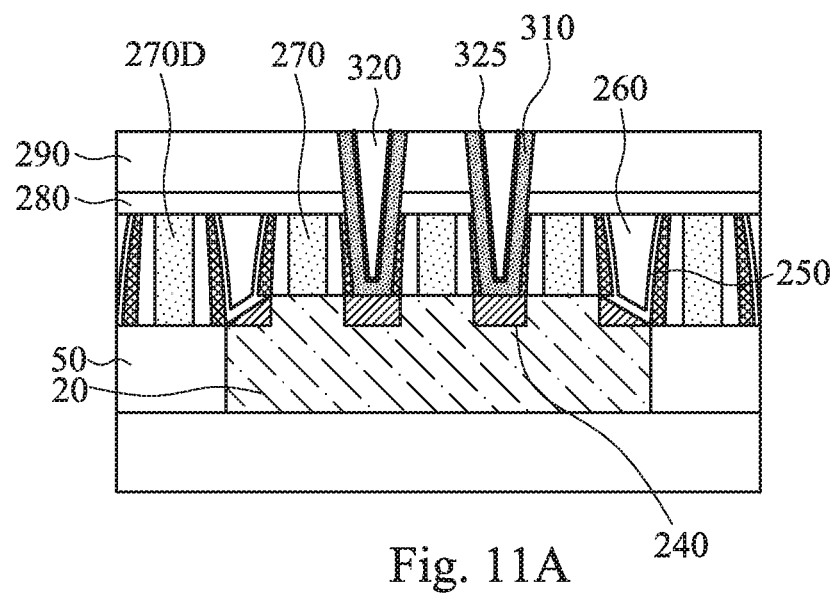
Figure 11B:
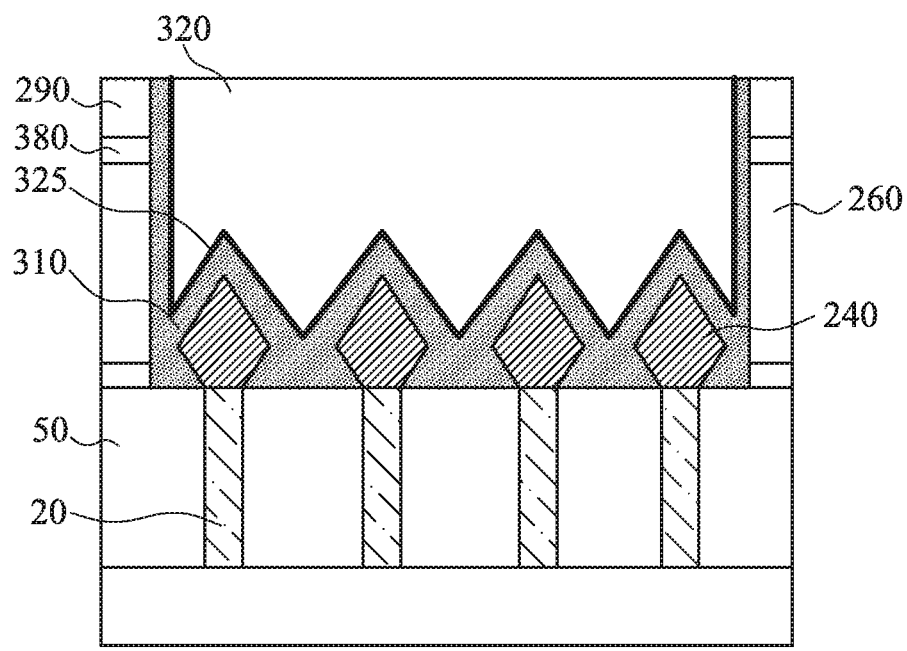

In S109 of FIG. 2, planarization operations are performed to remove part of the metal layer 320, silicide layer 325 and cap layer 310, and the resultant structure shown in FIGS. 11A and 11B is obtained. FIGS. 11A and 11B are exemplary cross sectional views of the Ge Fin FET device at one of the various stages of the fabrication process according to the first embodiment of the present disclosure. FIG. 11A corresponds to a cross sectional view along the line X-X' of FIG. 1 and FIG. 11B corresponds to a cross sectional view along the line Y-Y' of FIG. 1.

The planarization operations may include a CMP and/or an etch-back process. Part of the metal layer 320, silicide layer 325 and cap layer 310 disposed over the second interlayer dielectric layer are removed.

After the planarization operations, further CMOS processes are performed to form various features such as additional interlayer dielectric layer, contacts/vias, interconnect metal layers, and passivation layers, etc.

Figure 12:
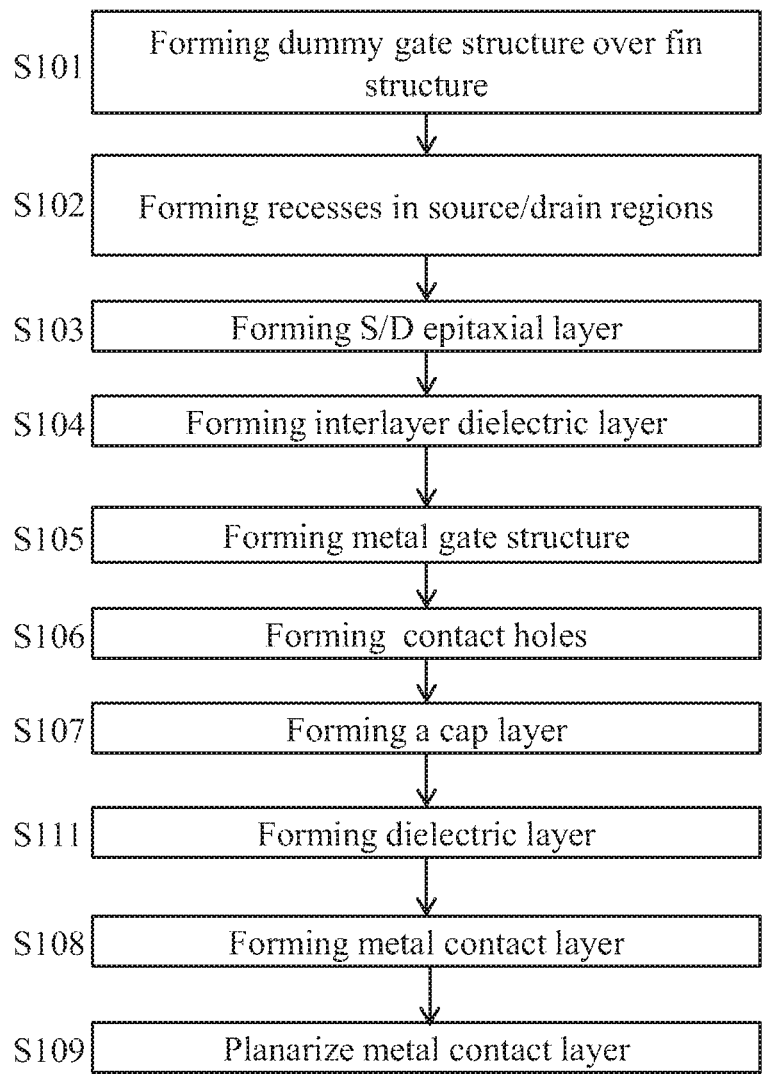
FIG. 12 is an exemplary flow chart for manufacturing a Ge Fin FET device according to a modified first embodiment of the present disclosure.

FIG. 12 is an exemplary flow chart for manufacturing a Ge Fin FET device according to a modified first embodiment of the present disclosure. In FIG. 12, S101-S109 are substantially the same as FIG. 2. In the modified first embodiment, a thin high-k dielectric layer 410 is formed (S111) between the SiP cap layer (S107) and the metal contact layer (S108).

Figure 13A:
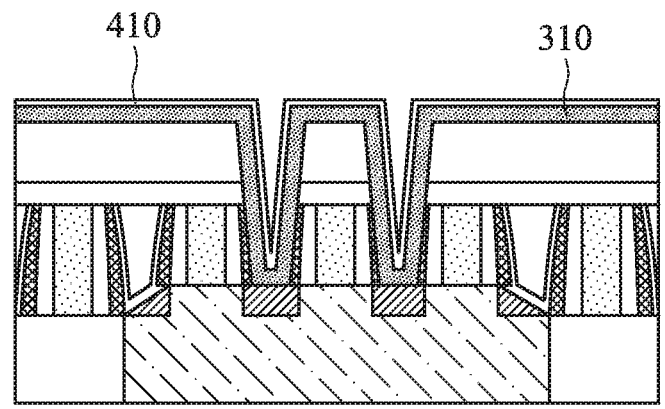
FIGS. 13A-14B show exemplary views of various stages for manufacturing a Ge Fin FET device according to the modified first embodiment of the present disclosure.
Figure 13B:
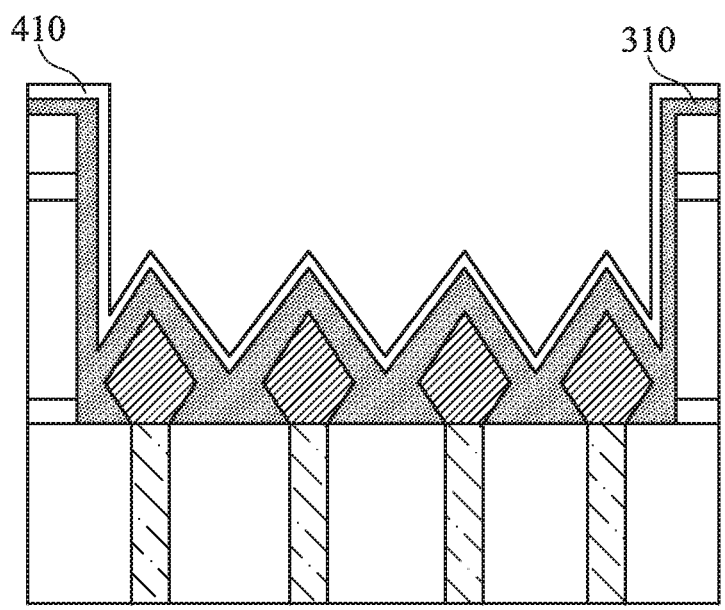

FIGS. 13A and 13B are exemplary cross sectional views of the Ge Fin FET device at one of the various stages of the fabrication process according to the modified first embodiment of the present disclosure. FIG. 13A corresponds to a cross sectional view along the line X-X' of FIG. 1 and FIG. 13B corresponds to a cross sectional view along the line Y-Y' of FIG. 1.

In S107 of FIG. 12, similar to S107 of FIG. 1, a SiP cap layer is formed. In the modified first embodiment, however, the thickness of SiP layer 310 is in a range of about 4 nm to about 6 nm on the source/drain regions and in a range of about 1 nm to about 2 nm on the interlayer dielectric layers and the sidewalls of the contact holes 300.

In S111 of FIG. 12, a thin high-k dielectric layer 410 is formed over the SiP cap layer 310. The thickness of the dielectric layer 410 is in a range of about 0.5 nm to about 3 nm. The high-k dielectric layer 410 may include silicon nitrides, aluminum oxides, aluminum oxide/silicon oxides, lanthanum oxides and/or lanthanum oxide/silicon oxides when the cap layer is silicon base. The high-k dielectric layer may include germanium nitrides, silicon oxynitrides, germanium oxides, aluminum oxides, magnesium oxides, and/or titanium oxides when the cap layer is germanium based. These dielectric materials may be stoichiometric or non-stoichiometric oxides compositions.

Figure 14A:
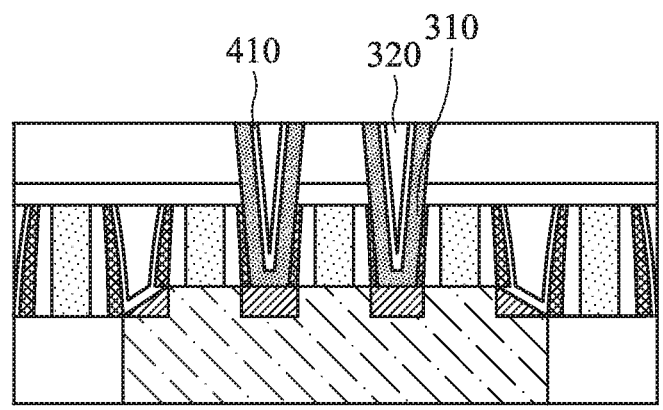
Figure 14B:
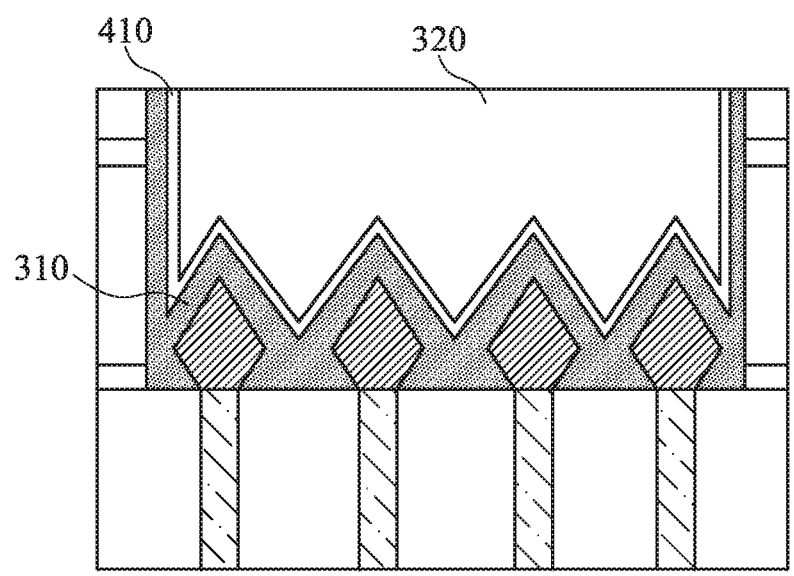

After forming the high-k dielectric layer 410, operations S108 and S109 of FIG. 12, which are substantially the same as S108 and S109 of FIG. 2, are performed, thereby obtaining the structure shown in FIGS. 14A and 14B. FIG. 14A corresponds to a cross sectional view along the line X-X' of FIG. 1 and FIG. 14B corresponds to a cross sectional view along the line Y-Y' of FIG. 1.

Although a dielectric layer 410 is disposed between the SiP cap layer 310 and the metal contact layer 320, because of a high dielectric constant and a small thickness, the tunnel barrier height in a band structure (MIS diagram) is reduced and a lower contact resistance can be obtained.

Figure 15:
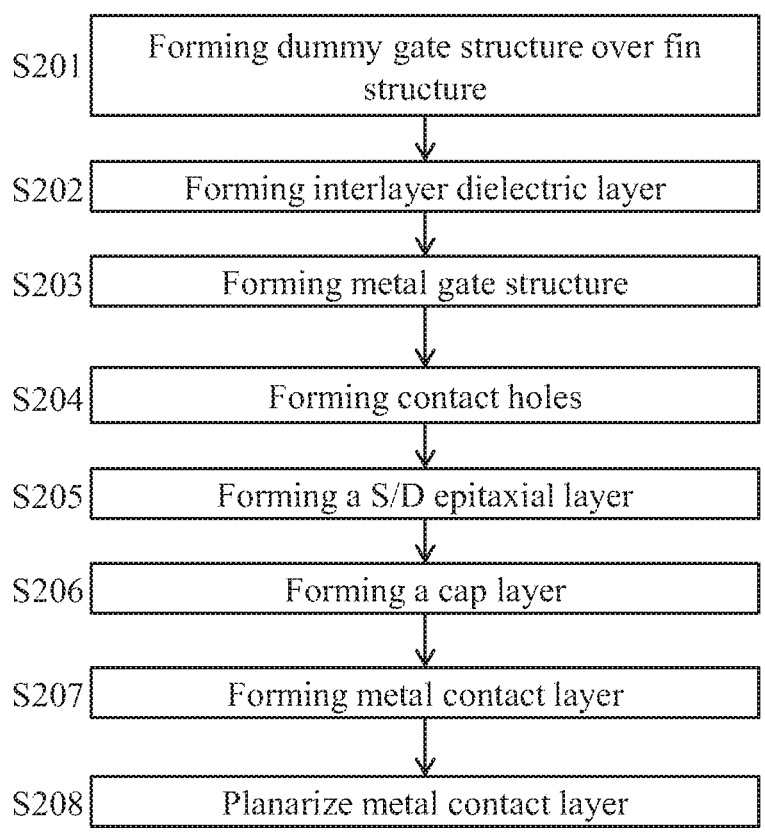
FIG. 15 is an exemplary flow chart for manufacturing a Ge Fin FET device according to a second embodiment of the present disclosure.

FIG. 15 is an exemplary flow chart for manufacturing a Ge Fin FET device according to a second embodiment of the present disclosure. The flow chart illustrates only a relevant part of the entire manufacturing process for a Ge Fin FET device. It is understood that additional operations may be provided before, during, and after processes shown by FIG. 15, and some of the operations described below can be replaced or eliminated for additional embodiments of the method. The order of the operations/processes may be interchangeable. The same or similar operations, processes, and materials as the first embodiment may be used in the second embodiment.

Figure 16A:
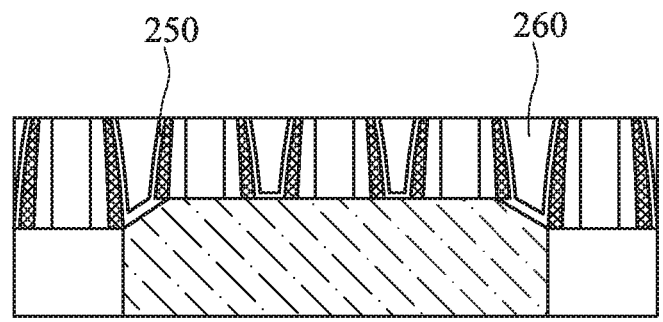
FIGS. 16A-22B show exemplary views of various stages for manufacturing a Ge Fin FET device according to the second embodiment of the present disclosure.
Figure 16B:
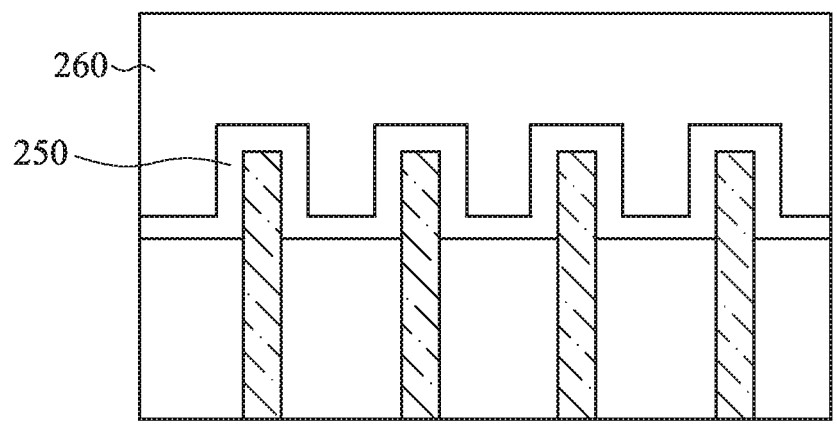

Similar to S101 of the first embodiment, dummy gate structures are formed in S201 of FIG. 15. The resultant structure is the same as FIGS. 3A and 3B. After the dummy gate structures are formed, a first interlayer dielectric layer including a first dielectric layer 250 and a second dielectric layer 260 are formed in S202 of FIG. 15. Planarization operations, such as CMP, are performed to remove part of the first interlayer dielectric layer. The resultant structure is shown in FIGS. 16A and 16B. FIG. 16A corresponds to a cross sectional view along the line X-X' of FIG. 1 and FIG. 16B corresponds to a cross sectional view along the line Y-Y' of FIG. 1. Unlike FIGS. 6A and 6B of the first embodiment, recesses and S/D epitaxial layers are not formed.

Figure 17A:
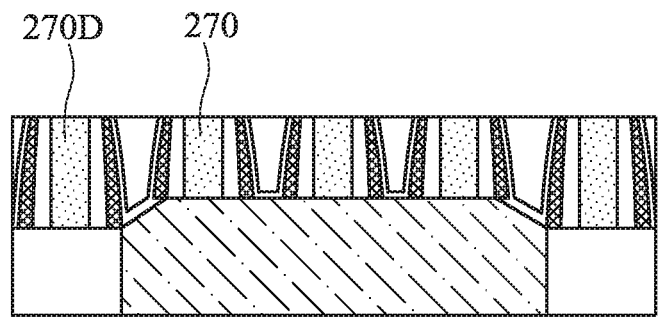
Figure 17B:
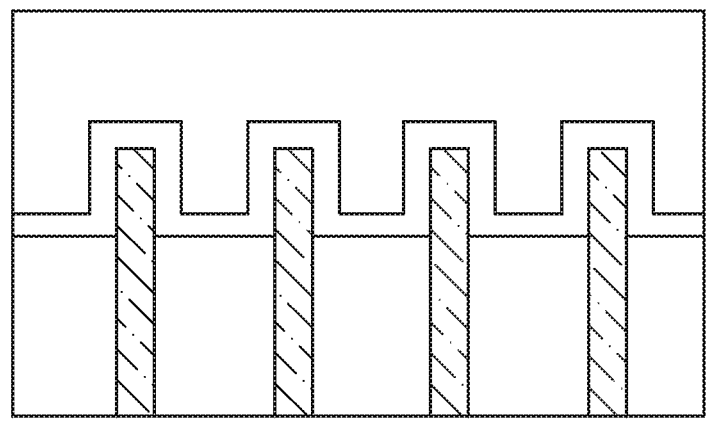

Similar to S105 of the first embodiment, metal gate structures are formed in S203. The dummy gate layers 210, 210D and the dummy dielectric layer are removed, by appropriate etching processes, respectively, to form openings. Metal gate structures including a gate dielectric layer (not shown) and metal gate layers 270, 270D are formed in the openings, as shown in FIGS. 17A and 17B. FIG. 17A corresponds to a cross sectional view along the line X-X' of FIG. 1 and FIG. 17B corresponds to a cross sectional view along the line Y-Y' of FIG. 1.

Figure 18A:
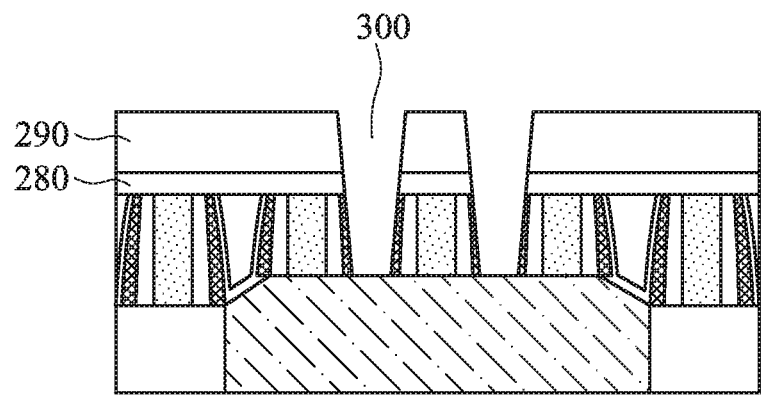
Figure 18B:
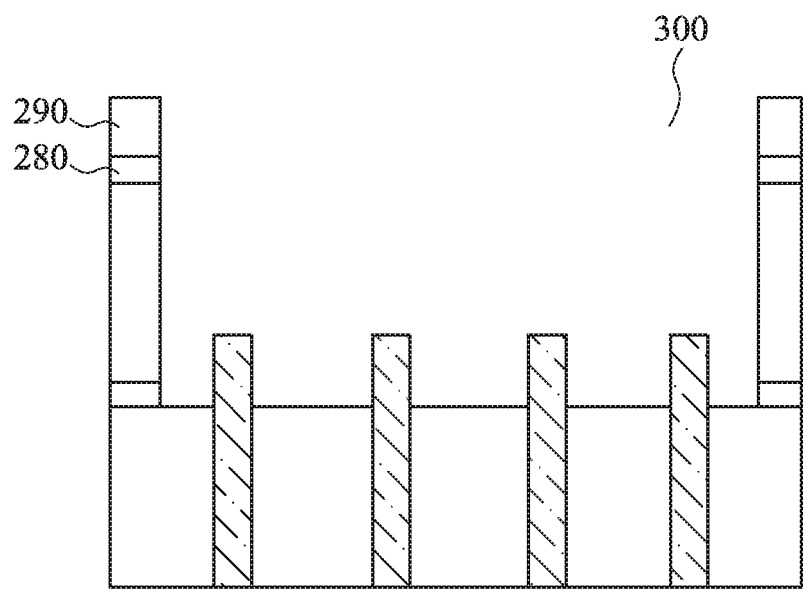

Similar to S106 of the first embodiment, a second interlayer dielectric layer including a first insulating layer 280 and a second insulating layer 290 is formed, and contact holes 300 are formed in the second and first interlayer dielectric layers, so as to expose source and drain regions, in S204 of FIG. 15. The resultant structure is shown in FIGS. 18A and 18B. FIG. 18A corresponds to a cross sectional view along the line X-X' of FIG. 1 and FIG. 18B corresponds to a cross sectional view along the line Y-Y' of FIG. 1.

Figure 19A:
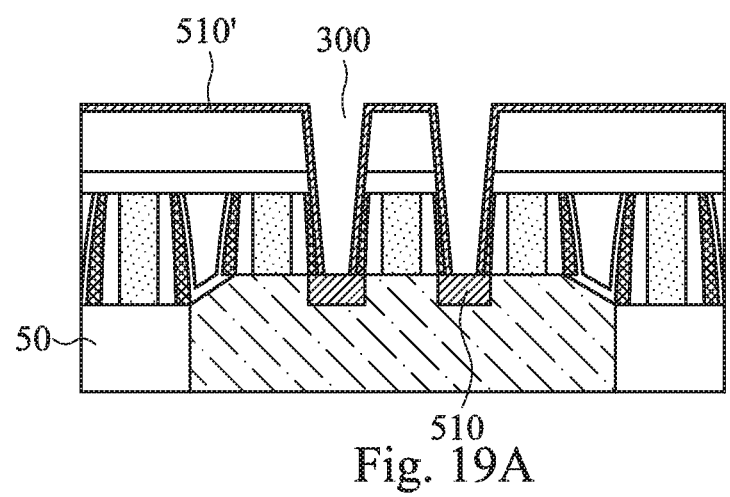
Figure 19B:
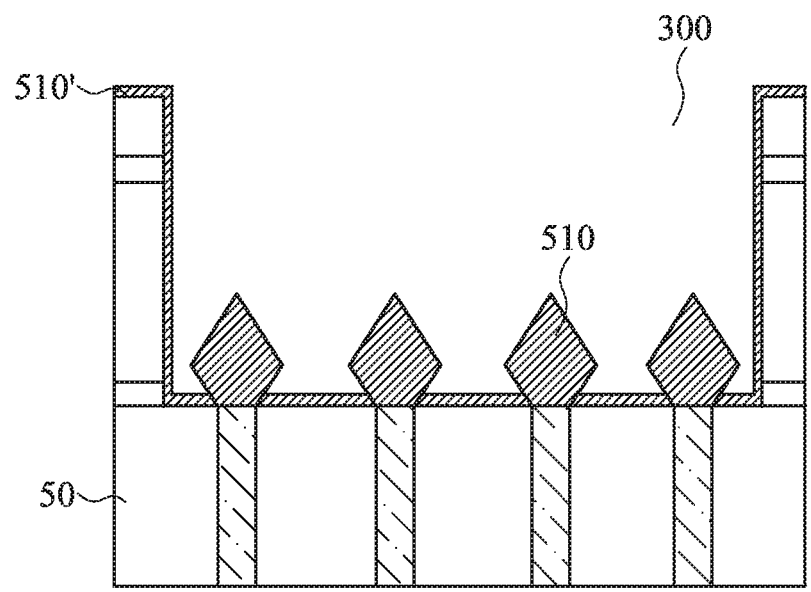

In S205 of FIG. 15, a source/drain (S/D) epitaxial layer 510, 510' is formed. Similar to S102 of the first embodiment, recesses are formed in part of the fin structures exposed in the contact holes 300. Similar to S102 of the first embodiment, an S/D epitaxial layer 510 is formed in the recess over the fin structures, as shown in FIGS. 19A and 19B. FIG. 19A corresponds to a cross sectional view along the line X-X' of FIG. 1 and FIG. 19B corresponds to a cross sectional view along the line Y-Y' of FIG. 1.

The S/D epitaxial layer 510, 510' includes GeP (germanium phosphide) in some embodiments. A concentration of P may be in a range of about $2 \times 10^{20}$ to about $6 \times 10^{20}$ cm$^{-3}$, which is higher than the P concentration of the GeP layer 240 of the first embodiment. The GeP epitaxial grown is performed at a temperature of about 300 to 600° C. under a pressure of about 80 to 150 Torr, by using a Ge containing gas such as GeH$_4$, Ge$_2$H$_6$, GeCl$_2$H$_2$ and a phosphorous containing gas such as PH$_3$. With this epitaxial growth, the GeP layers are formed not only on the fin structures, but also on the isolation insulating layer 50, the side walls of the contact holes 300 and the second interlayer dielectric layer, as shown in FIGS. 19A and 19B. The thickness of the GeP layer 510' formed on the isolation insulating layer 50, the side walls of the contact holes 300 and the second interlayer dielectric layer is in a range of about 1 nm to about 2 nm.

Figure 20A:
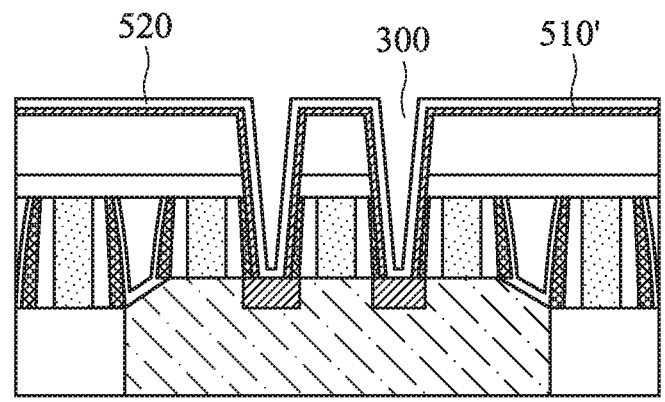
Figure 20B:
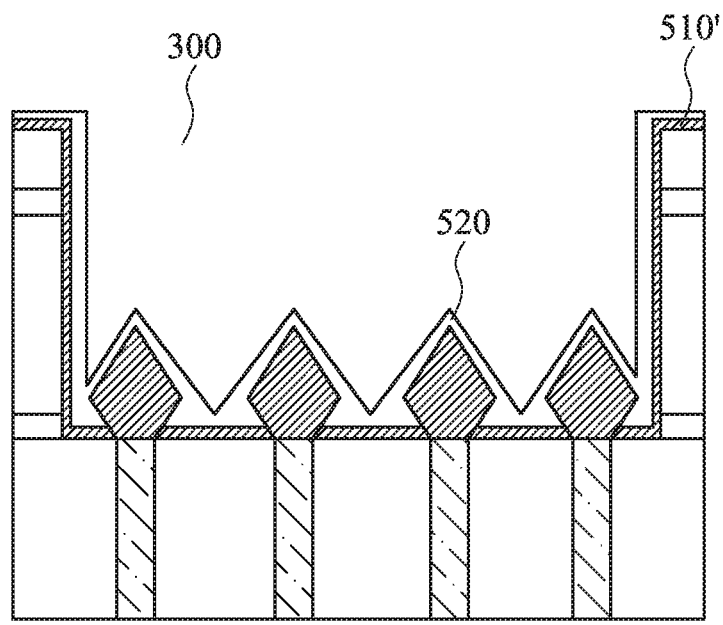

In S206 of FIG. 15, a cap layer 520 is formed in the contact holes as shown in FIGS. 20A and 20B, similar to S107 of the first embodiment. FIGS. 20A and 20B are exemplary cross sectional views of the Ge Fin FET device at one of the various stages of the fabrication process according to the first embodiment of the present disclosure. FIG. 20A corresponds to a cross sectional view along the line X-X' of FIG. 1 and FIG. 20B corresponds to a cross sectional view along the line Y-Y' of FIG. 1.

The cap layer 520 may include SiP (silicon phosphide). A concentration of P may be in a range of about $1 \times 10^{21}$ to about $3 \times 10^{21}$ cm$^{-3}$. The SiP formation is performed at a low temperature of about 300 to 600° C. under a pressure of about 20 to 60 Torr, by using a Si containing gas such as SiH$_4$, Si$_2$H$_6$, SiCl$_2$H$_2$ and a phosphorous containing gas such as PH$_3$. By this deposition, SiP is formed not only on the source/drain regions (GeP layer 510) of the fin structures but also on the GeP layer 510' formed on the interlayer dielectric layers and the sidewalls of the contact holes 300. The thickness of SiP layer 520 is in a range of about 8 nm to about 10 nm on the source/drain regions and in a range of about 4 nm to about 6 nm over the interlayer dielectric layers and the sidewalls of the contact holes 300. The SiP layer 520 may be epitaxially grown over the source/drain regions of the fin structures.

Figure 21A:
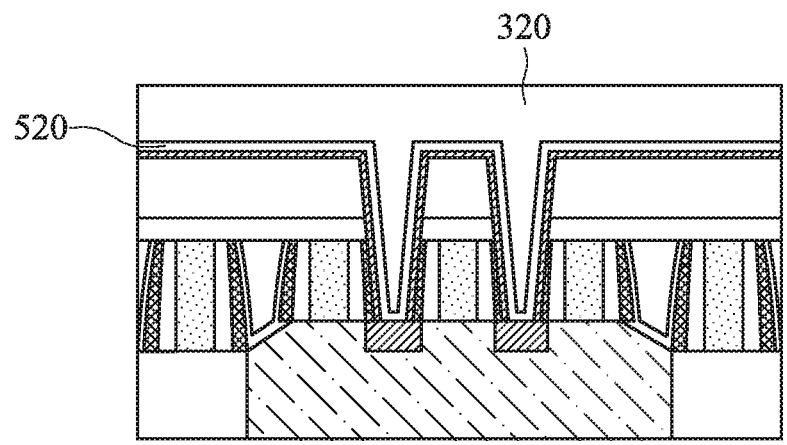
Figure 21B:
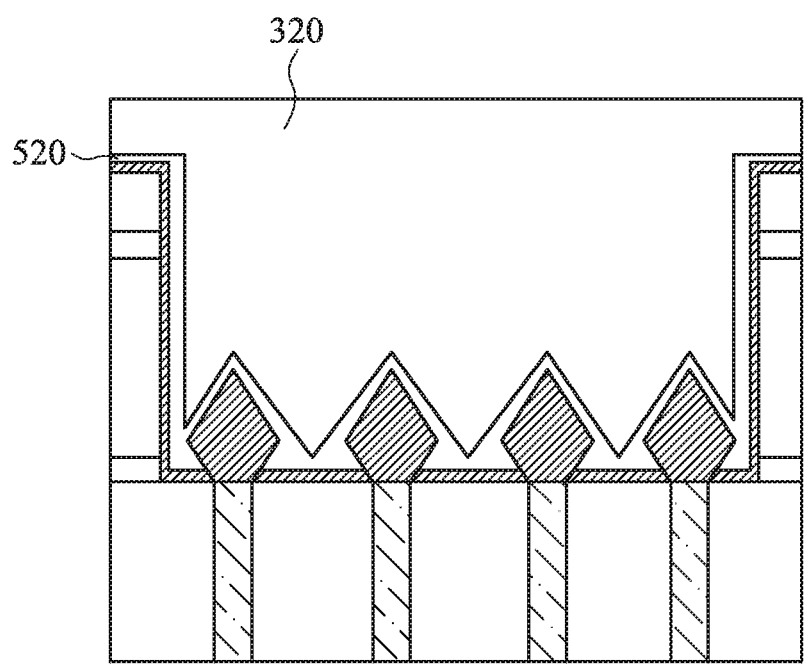

In S207 of FIG. 15, similar to S108 of the first embodiment, a contact metal layer 320 is formed over the cap layer 520 as shown in FIGS. 21A and 21B. FIGS. 21A and 21B are exemplary cross sectional views of the Ge Fin FET device at one of the various stages of the fabrication process according to the first embodiment of the present disclosure. FIG. 21A corresponds to a cross sectional view along the line X-X' of FIG. 1 and FIG. 21B corresponds to a cross sectional view along the line Y-Y' of FIG. 1.

After forming the contact metal layer 320, an alloy layer may be formed between the cap layer 520 and contact metal layer 320. For example, a silicide formation operation may be performed so as to make a silicide layer 525 between the contact metal layer 320 and SiP cap layer 520. The silicide formation operations may include an annealing process at a temperature of about 250° C. to 850° C.

The thickness of the silicide layer 525 on the source/drain regions is in a range of about 5 nm to about 7 nm, and a portion of the SiP layer remains after silicidation.

Figure 22A:
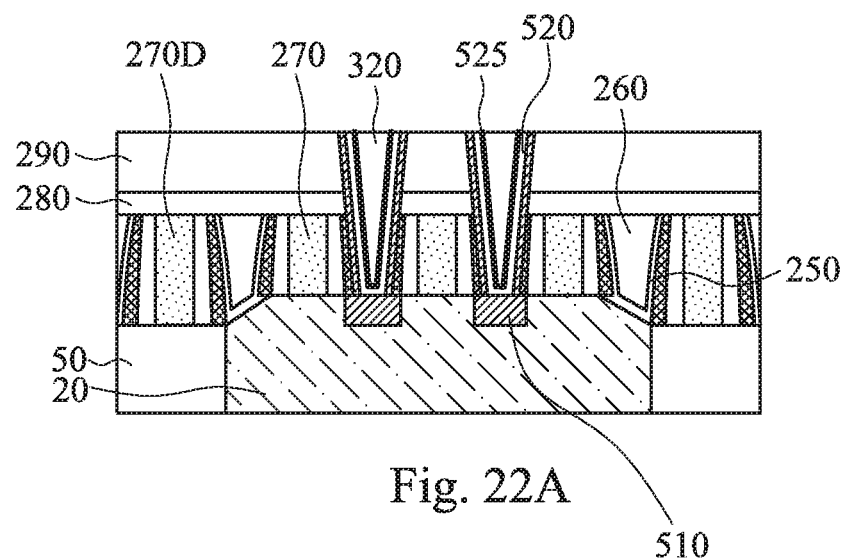
Figure 22B:
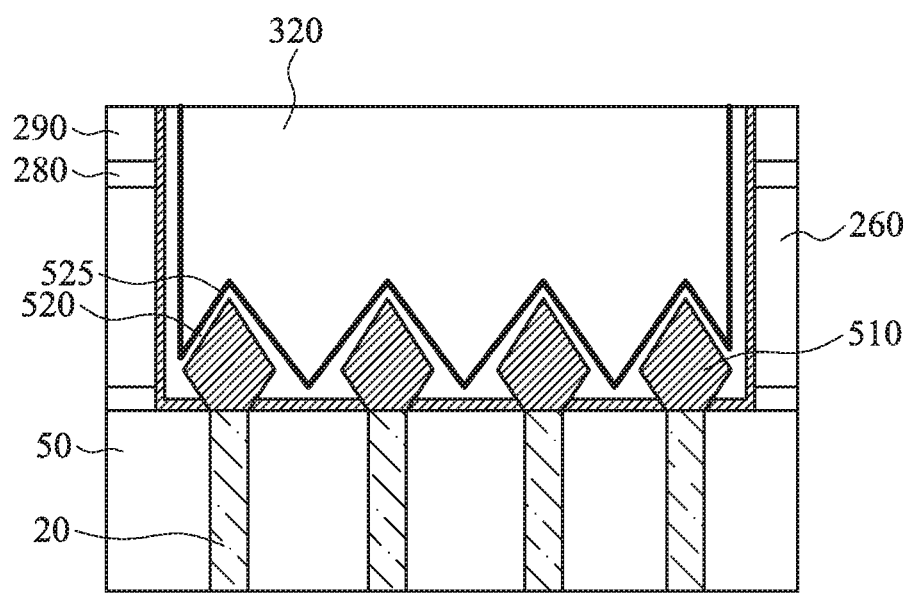

In S208 of FIG. 15, similar to S109 of the first embodiment, planarization operations are performed to remove part of the metal layer 320, silicide layer 525 and cap layer 520, and the resultant structure shown in FIGS. 22A and 22B is obtained. FIGS. 22A and 22B are exemplary cross sectional views of the Ge Fin FET device at one of the various stages of the fabrication process according to the first embodiment of the present disclosure. FIG. 22A corresponds to a cross sectional view along the line X-X' of FIG. 1 and FIG. 22B corresponds to a cross sectional view along the line Y-Y' of FIG. 1.

The planarization operations may include a CMP and/or an etch-back process. Part of the metal layer 320, silicide layer 525 and cap layer 520 disposed over the second interlayer dielectric layer are removed.

After the planarization operations, further CMOS processes are performed to form various features such as additional interlayer dielectric layer, contacts/vias, interconnect metal layers, and passivation layers, etc.

Figure 23:
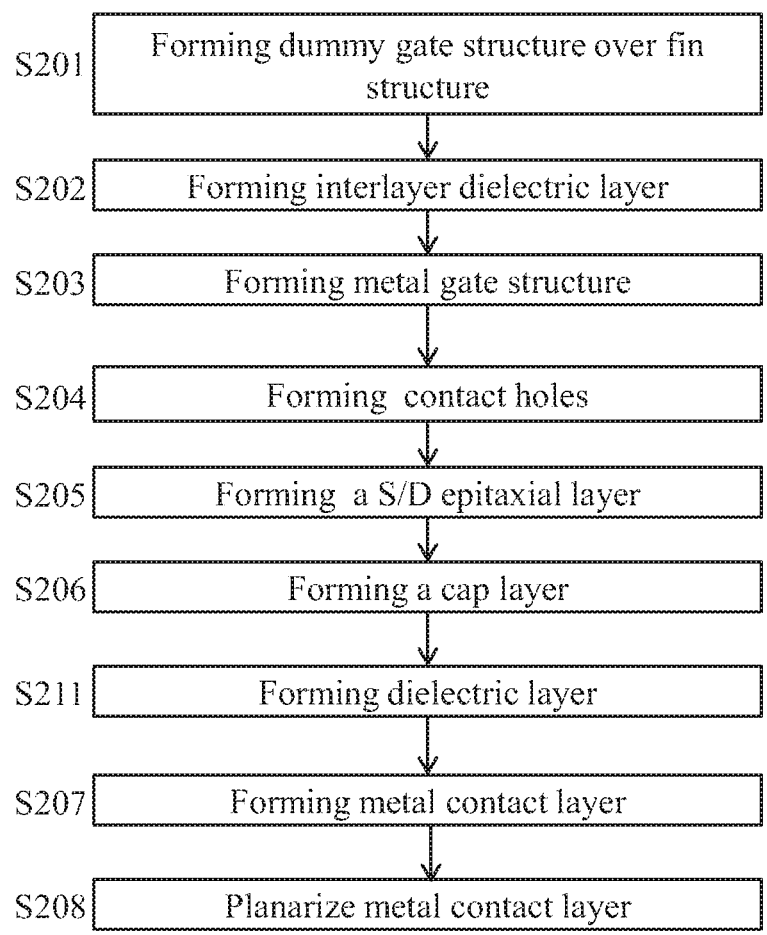
FIG. 23 is an exemplary flow chart for manufacturing a Ge Fin FET device according to a modified second embodiment of the present disclosure.

FIG. 23 is an exemplary flow chart for manufacturing a Ge Fin FET device according to a modified second embodiment of the present disclosure. In FIG. 23, S201-S208 are substantially the same as FIG. 12. In the modified second embodiment, a thin high-k dielectric layer 610 is formed (S211) between the SiP cap layer (S206) and the metal contact layer (S207).

Figure 24A:
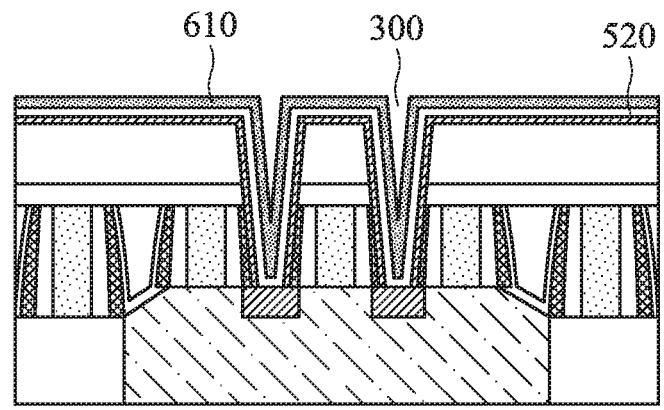
FIGS. 24A-25B show exemplary views of various stages for manufacturing a Ge Fin FET device according to the modified second embodiment of the present disclosure.
Figure 24B:
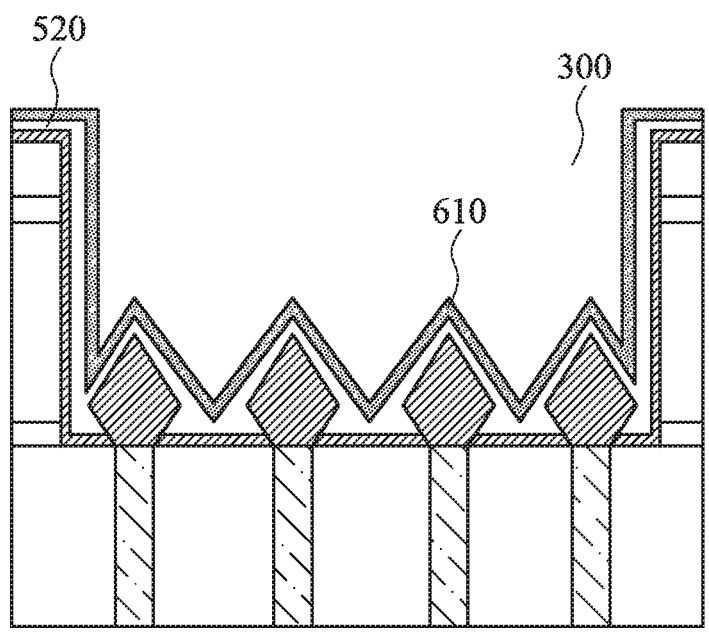

FIGS. 24A and 24B are exemplary cross sectional views of the Ge Fin FET device at one of the various stages of the fabrication process according to the modified second embodiment of the present disclosure. FIG. 24A corresponds to a cross sectional view along the line X-X' of FIG. 1 and FIG. 24B corresponds to a cross sectional view along the line Y-Y' of FIG. 1.

In S206 of FIG. 23, similar to S206 of FIG. 15, a SiP cap layer is formed. In the modified second embodiment, however, the thickness of SiP layer 520 is in a range of about 4 nm to about 6 nm on the source/drain regions and in a range of about 1 nm to about 2 nm on the interlayer dielectric layers and the sidewalls of the contact holes 300.

In S211 of FIG. 23, a thin high-k dielectric layer 610 is formed over the SiP cap layer 520. The thickness of the dielectric layer 610 is in a range of about 0.5 nm to about 3 nm. The high-k dielectric layer 610 may include silicon nitrides, aluminum oxides, aluminum oxide/silicon oxides, lanthanum oxides, and/or lanthanum oxide/silicon oxides when the cap layer is silicon based. The high-k dielectric layer may include germanium nitrides, silicon oxynitrides, germanium oxides, aluminum oxides, magnesium oxides, and/or titanium oxides when the cap layer is germanium based. These dielectric materials may be stoichiometric or non-stoichiometric compositions.

Figure 25A:
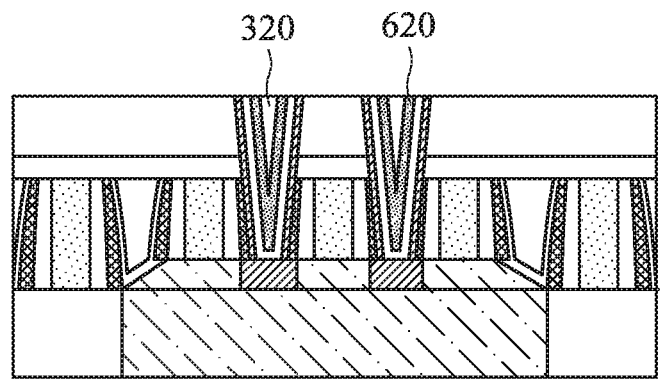
Figure 25B:
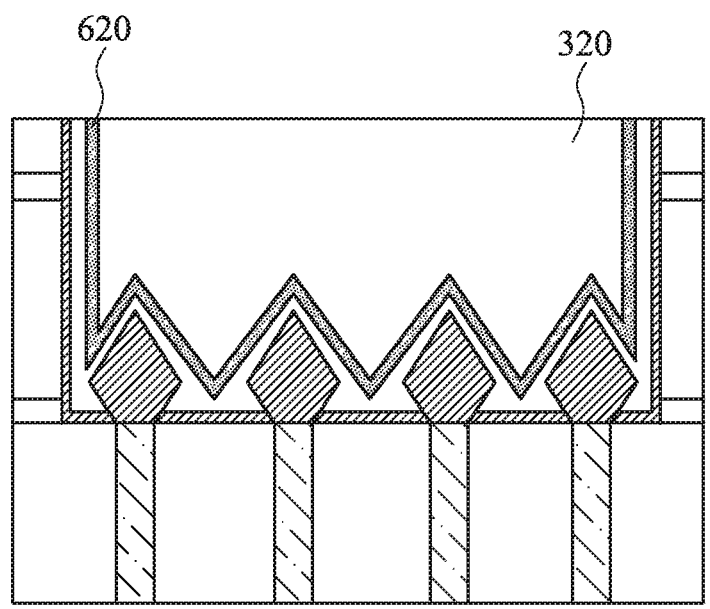

After forming the high-k dielectric layer 610, operations S207 and S208 of FIG. 15 are performed, thereby obtaining the structure shown in FIGS. 25A and 25B. FIG. 25A corresponds to a cross sectional view along the line X-X' of FIG. 1 and FIG. 25B corresponds to a cross sectional view along the line Y-Y' of FIG. 1.

Although a dielectric layer 620 is disposed between the SiP cap layer 520 and the metal contact layer 320, because of a high dielectric constant and a small thickness, the tunnel barrier height in a band structure (MIS diagram) is reduced and a lower contact resistance can be obtained.

In the first and second embodiments, a gate-replacement technology with a metal gate electrode and a high-k gate dielectric is employed. However, a gate-first technology with a poly-gate structure may also be employed. In the gate-first technology, the dummy gate layers 210 are the gate electrodes.

Generally, the use of Ge or a Ge based material has problems such as a lower N-type dopant activation level and Fermi level pinning near the valence band, which cause an increase of an N-type contact resistance between source/drains and contact metals for N-type Ge Fin FETs. In the present disclosure, by using $N^+$ SiP cap layer formed over the source/drain GeP layer, the Fermi level pinning can be suppressed.

Further, the SiP cap layer is formed after the contact hole formation, it is possible to prevent the cap layer from missing in the contact etching process. Further, an N-type contact resistance between source/drain and contact metals for N-type Ge Fin FETs can be reduced.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure is formed over a substrate. The fin structure extends in a first direction and includes an upper layer. Part of the upper layer is exposed from an isolation insulating layer. A source/drain structure is formed in the fin structure. A gate structure is formed over part of the fin structure. The gate structure extends in a second direction perpendicular to the first direction. An interlayer dielectric layer is formed over the fin structure, the source/drain structure and the gate structure. A contact hole is formed in the interlayer dielectric layer so that the source/drain structure is exposed. A cap layer is formed in the contact hole. A contact metal layer is formed over the cap layer.

In accordance with another aspect of the present disclosure, in a method of manufacturing a semiconductor device including a Fin FET, a fin structure is formed over a substrate. The fin structure extends in a first direction and includes an upper layer. Part of the upper layer is exposed from an isolation insulating layer. A gate structure is formed over part of the fin structure. The gate structure extends in a second direction perpendicular to the first direction. An amorphous layer is formed over the gate structure and the fin structure not covered by the gate structure. An interlayer dielectric layer is formed over the fin structure and the gate structure. A contact hole is formed in the interlayer dielectric layer so that part of the fin structure is exposed. A source/drain structure is formed in the exposed fin structure. A cap layer is formed in the contact hole over the source/drain structure. A contact metal layer is formed over the cap layer.

In accordance with another aspect of the present disclosure, a semiconductor device includes a fin structure disposed over a substrate; a gate structure disposed over part of the fin structure; a source/drain structure, which includes part of the fin structure not covered by the gate structure; an interlayer dielectric layer formed over the fin structure, the gate structure, and the source/drain structure; a contact hole formed in the interlayer dielectric layer; and a contact material disposed in the contact hole. The fin structure extends in a first direction and includes an upper layer, wherein a part of the upper layer being exposed from an isolation insulating layer. The gate structure extends in a second direction perpendicular to the first direction. The contact material includes a silicon phosphide layer and a metal layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
   forming a fin structure over a substrate, the fin structure extending in a first direction and including an upper layer, a part of the upper layer being exposed from an isolation insulating layer;
   forming a dummy gate structure over a part of the fin structure, the dummy gate structure extending in a second direction crossing the first direction;
   removing the dummy gate structure and forming a gate structure in a region in which the dummy gate structure is removed;
   forming an interlayer dielectric layer over the fin structure and the gate structure;
   forming a contact hole in the interlayer dielectric layer so that a part of the fin structure is exposed;
   forming a source/drain structure on the exposed fin structure;
   directly depositing a cap layer, by using a first gas and a second gas, on the source/drain structure, the cap layer covering a bottom surface and sidewalls of the contact hole;
   forming a dielectric layer over the cap layer; and
   forming a contact metal layer over the dielectric layer.

2. The method of claim 1, further comprising forming an alloy layer between the cap layer and the contact metal layer.

3. The method of claim 2, further comprising planarizing the contact metal layer, the alloy layer, and the cap layer disposed over the interlayer dielectric layer.

4. The method of claim 1, wherein:
   the fin structure is made of germanium or germanium compound, and
   the cap layer includes a silicon compound.

5. The method of claim 4, wherein:
   the silicon compound is silicon phosphide, and
   the first gas is a silicon containing gas and the second gas is a phosphorous containing gas.

6. The method of claim 1, wherein:
   the fin structure is made of germanium or germanium compound, and
   the dielectric layer includes at least one selected from the group consisting of silicon nitride, aluminum oxide and lanthanum oxide.

7. The method of claim 6, wherein:
   the cap layer includes silicon phosphide, and
   the first gas is a silicon containing gas and the second gas is a phosphorous containing gas.

8. The method of claim 1, wherein the source/drain structure includes germanium phosphide.

9. A method of manufacturing a semiconductor device including a Fin FET, the method comprising:
   forming a fin structure over a substrate, the fin structure extending in a first direction and including an upper layer, a part of the upper layer being exposed from an isolation insulating layer;
   forming a gate structure over a part of the fin structure, the gate structure extending in a second direction crossing the first direction;
   forming an interlayer dielectric layer over the fin structure and the gate structure;
   forming a contact hole in the interlayer dielectric layer so that a part of the fin structure is exposed;
   forming a source/drain structure on the exposed fin structure;
   directly depositing a cap layer, by using a first gas and a second gas, on the source/drain structure, the cap layer covering a bottom surface and sidewalls of the contact hole; and
   forming a contact metal layer over the cap layer.

10. The method of claim 9, further comprising forming an alloy layer between the cap layer and the contact metal layer.

11. The method of claim 9, wherein:
    fin structure is made of germanium or germanium compound, and
    the cap layer includes a silicon compound.

12. The method of claim 11, wherein:
    the silicon compound is silicon phosphide, and
    the first gas is a silicon containing gas and the second gas is a phosphorous containing gas.

13. The method of claim 9, wherein:
    the fin structure is made of germanium or germanium compound, and
    the dielectric layer includes at least one selected from the group consisting of silicon nitride, aluminum oxide and lanthanum oxide.

14. The method of claim 13, wherein:
    the cap layer includes silicon phosphide, and
    the first gas is a silicon containing gas and the second gas is a phosphorous containing gas.

15. The method of claim 9, wherein the source/drain structure includes germanium phosphide.

16. A method of manufacturing a semiconductor device including a Fin FET, the method comprising:
    forming a fin structure over a substrate, the fin structure extending in a first direction and including an upper layer, a part of the upper layer being exposed from an isolation insulating layer;
    forming a gate structure over a part of the fin structure, the gate structure extending in a second direction crossing the first direction;
    forming an interlayer dielectric layer over the fin structure and the gate structure;
    forming a contact hole in the interlayer dielectric layer so that a part of the fin structure is exposed;
    forming a source/drain structure on the exposed fin structure;
    directly depositing forming a cap layer, by using a first gas and a second gas, on the source/drain structure, the cap layer covering a bottom surface and sidewalls of the contact hole;
    forming a contact metal layer over the cap layer; and
    performing a planarization process to remove portions of the contact metal layer and the cap layer over the interlayer dielectric layer.

17. The method of claim 16, wherein: the fin structure is made of germanium or germanium compound.

18. The method of claim 16, wherein the source/drain structure includes germanium phosphide.

19. The method of claim 16, wherein the interlayer dielectric layer has a multilayer structure including a first insulating layer and a second insulating layer.

20. The method of claim 19, wherein the first insulating layer is made of silicon nitride, and the second insulating layer is made of silicon oxide, silicon nitride, silicon oxynitride (SiON), SiOCN, fluoride-doped silicate glass (FSG), or a low-K dielectric material.

21. The method of claim 16, wherein:
the cap layer includes a silicon compound including silicon phosphide, and
the first gas is a silicon containing gas and the second gas is a phosphorous containing gas.

* * * * *